United States Patent [19]

Clarke

[11] Patent Number: 5,914,017
[45] Date of Patent: *Jun. 22, 1999

[54] APPARATUS FOR, AND METHOD OF, REMOVING HYDROCARBONS FROM THE SURFACE OF A SUBSTRATE

[75] Inventor: Peter J. Clarke, Santa Barbara, Calif.

[73] Assignee: Sputtered Films, Inc., Santa Barbara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/651,377
[22] Filed: May 22, 1996
[51] Int. Cl.[6] .............................. C23C 14/34; B08B 7/00
[52] U.S. Cl. ............................. 204/298.07; 204/298.09; 204/298.14; 204/298.18; 134/201; 134/1.1; 134/1.2
[58] Field of Search ................... 204/298.01, 298.06, 204/298.07, 298.08, 298.09, 298.12, 298.14, 298.16, 298.17, 298.18, 298.19; 134/201, 1.1, 1.2; 422/186, 186.04, 186.21, 186.29

[56] References Cited

U.S. PATENT DOCUMENTS

| 4,710,283 | 12/1987 | Singh et al. | 204/298.01 |
|---|---|---|---|
| 5,135,634 | 8/1992 | Clarke | 204/298.18 |

*Primary Examiner*—Nam Nguyen
*Assistant Examiner*—Rodney G. McDonald
*Attorney, Agent, or Firm*—Ellsworth R. Roston; Fulwider Patton Lee & Utecht, LLP

[57] ABSTRACT

An electrical field between a positive anode and a negative target in a cavity and a magnetic field in the cavity produce electron flow from the target in a convoluted path for ionizing a gas such as oxygen flowing through the cavity. The ionized oxygen forms positive and negative oxygen ions which flow from the cavity to an aluminum oxide surface on a substrate. The aluminum oxide surface may contain hydrocarbon molecules which prevent a thin magnetizable layer from adhering uniformly on the aluminum oxide surface. The ionized oxygen molecules and atoms flow through the cavity at a reduced rate and react chemically with the hydrocarbon molecules to form water vapor and carbon monoxide and/or carbon dioxide gases. By removing the hydrocarbons from the aluminum oxide surface, the layer of the magnetizable material is deposited adheringly on the aluminum oxide surface. A neutral gas (e.g. argon atoms) flows through the cavity, at a rate reduced from the normal flow rate, with the oxygen to become ionized by the electrons. The ionized argon atoms cause atoms to be sputtered from the target for movement toward the substrate surface. When the target is made from aluminum, aluminum oxide ($Al_2O_3$, $Al_2O_2$, $Al_2O$, etc.), atoms are deposited on the substrate surface because of the reaction of the aluminum atoms with the oxygen in the cavity. However, the aluminum oxide layer deposited is quite thin and does not affect the action of the oxygen in removing the hydrocarbons from the substrate surface.

30 Claims, 2 Drawing Sheets

APPARATUS FOR, AND METHOD OF, REMOVING HYDROCARBONS FROM THE SURFACE OF A SUBSTRATE

This invention relates to apparatus for, and methods of, cleaning the surfaces of substrates, such as wafers for integrated circuit chips or for magnetic transducer heads, to remove hydrocarbons on such substrates. By cleaning such surfaces of hydrocarbons, depositions can be provided on such surfaces for firm retention on such surfaces.

BACKGROUND OF THE INVENTION

Wafers are fabricated with a plurality of dies (sometimes as many as hundreds) on each wafer. Each of the dies on a wafer subsequently forms an integrated circuit chip or magnetic transducer head. The dies are tested while on the wafer to determine if they have been produced properly. The defective dies are marked to distinguish them from the satisfactory dies. The dies are then cut from the wafer and the satisfactory dies are retained for use as integrated circuit chips.

When the dies on the wafers are intended to form integrated circuit chips, the wafers are produced from a plurality of successive layers, some of electrically conductive material and others of electrically insulating material. Each of these layers has an individual pattern. When a layer of an electrically conductive material is formed, it generally is produced in a pattern to represent electrical circuitry. To produce this electrical circuitry, a layer of an electrically conductive material is initially deposited on the wafer, hopefully in a substantially uniform thickness. The layer may then be masked with a material which is subjected to light in a pattern corresponding to the pattern of the electrical circuitry to be produced. The masking material subjected to the light is impervious to an etching material such as an acid.

The remaining portions of the layer may then be etched as by an acid. The masking material subjected to the light may then be removed from the remaining electrically conductive material in the layer. The electrically conductive material remaining in such layer, and the electrically conductive material in a plurality of other layers produced in the same manner, define the electrical circuitry for each die on the wafer.

Substrates may also be fabricated to provide dies which are then coated with a magnetizable material to be used in magnetic heads. The magnetic head is then disposed in contiguous relationship to a memory member such as a magnetizable disc. A transducing action is then provided between the magnetic head and the magnetizable disc to transfer information, generally binary, between the die on the magnetic head and the magnetizable disc.

The die for magnetic heads are generally made from an insulating material or are coated with an insulating material before subsequent layers are deposited on the insulating material. For example, the dies for integrated circuit chips are made from silicon dioxide. The dies for magnetic heads are generally coated with a layer of aluminum oxide. The insulating material or the insulating layer sometimes have artifacts in the layer. For example, hydrocarbons sometimes occur on the surface of the insulating material or the insulating layer. Such hydrocarbons prevent subsequent layers of material from being deposited uniformly on the insulating material in part from the fact that the depositions do not fully adhere to the hydrocarbons. The problem discussed in this paragraph has existed for some time.

BRIEF DESCRIPTION OF THE INVENTION

This invention provides a system for, and a method of, overcoming the difficulties specified above.

In one embodiment of the invention, an electrical field between a positive anode and a negative target in a cavity and a magnetic field in the cavity produce electron flow from the target in a convoluted path for ionizing a gas such as oxygen flowing through the cavity. The ionized oxygen forms positive and negative oxygen ions which flow from the cavity to an aluminum oxide surface on a substrate.

The aluminum oxide surface may contain hydrocarbon molecules which prevent a thin magnetizable layer from adhering uniformly on the aluminum oxide surface. The ionized oxygen molecules and atoms flow through the cavity at a reduced rate and react chemically with the hydrocarbon molecules to form water vapor and carbon monoxide and/or carbon dioxide gases. By removing the hydrocarbons from the aluminum oxide surface, the layer of the magnetizable material is deposited adheringly on the aluminum oxide surface.

A neutral gas (e.g. argon atoms) flows through the cavity, at a rate reduced from the normal flow rate, WITH THE OXYGEN to become ionized by the electrons. The ionized argon atoms cause atoms to be sputtered from the target for movement toward the substrate surface. When the target is made from aluminum, aluminum oxide ($Al_2O_3$, $Al_2O_2$, $Al_2O$, etc.) atoms are deposited on the substrate surface because of the reaction of the aluminum atoms with the oxygen in the cavity. However, the aluminum oxide layer deposited is quite thin and does not affect the action of the oxygen in removing the hydrocarbons from the substrate surface.

DETAILED DESCRIPTION OF THE INVENTION

Figure 1:
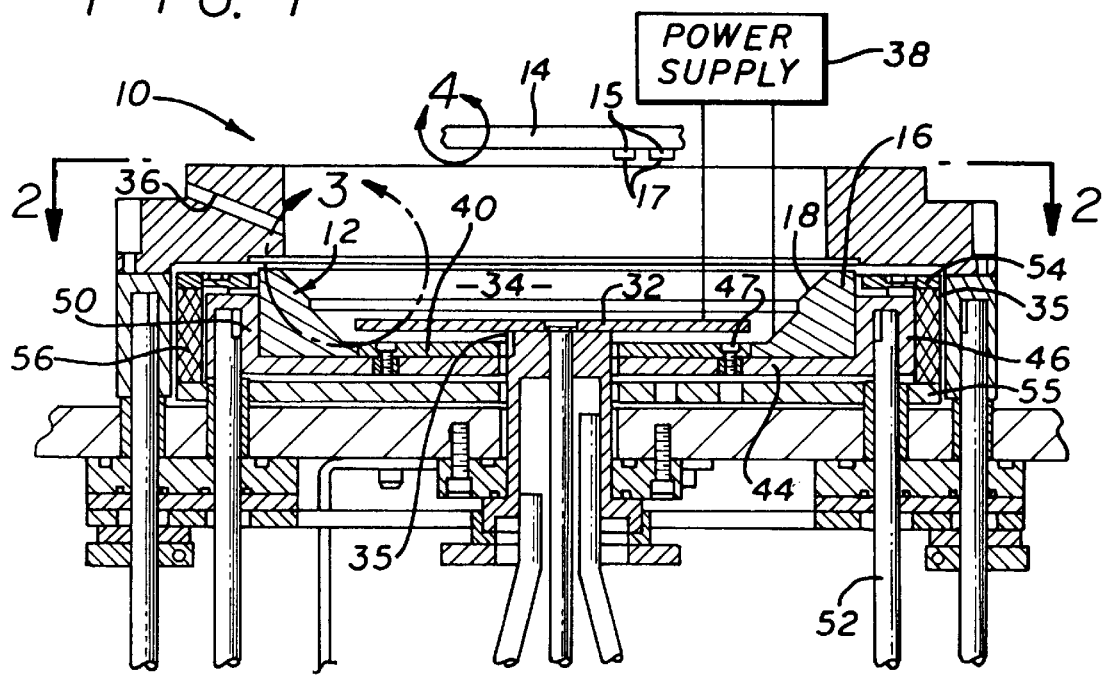
FIG. 1 is a fragmentary sectional view, in side elevation, of apparatus constituting one embodiment of the invention for cleaning a surface of a substrate of foreign material such as hydrocarbons.

In one embodiment of the invention, apparatus generally indicated at 10 in FIG. 1 is provided for cleaning the surface of substrate 14. As one alternative, the substrate 14 may constitute a wafer which is used in the semiconductor industry to produce dies subsequently packaged to become integrated circuit chips. As another alternative, the substrate 14 may constitute a wafer for producing dies which are used in magnetizable heads to provide a transfer of data, often binary, between the magnetizable heads and magnetizable discs contiguous to the heads.

The substrate 14 may be in the form of a thin disc made from a suitable material such as silicon dioxide and having a suitable diameter such as approximately five inches (5"). The substrate 14 may preferably have a floating potential. This is facilitated by the fact that the substrate 14 is generally made from an insulating material such as silicon dioxide and/or may be coated with a material such as aluminum dioxide having insulating properties.

Figure 3:
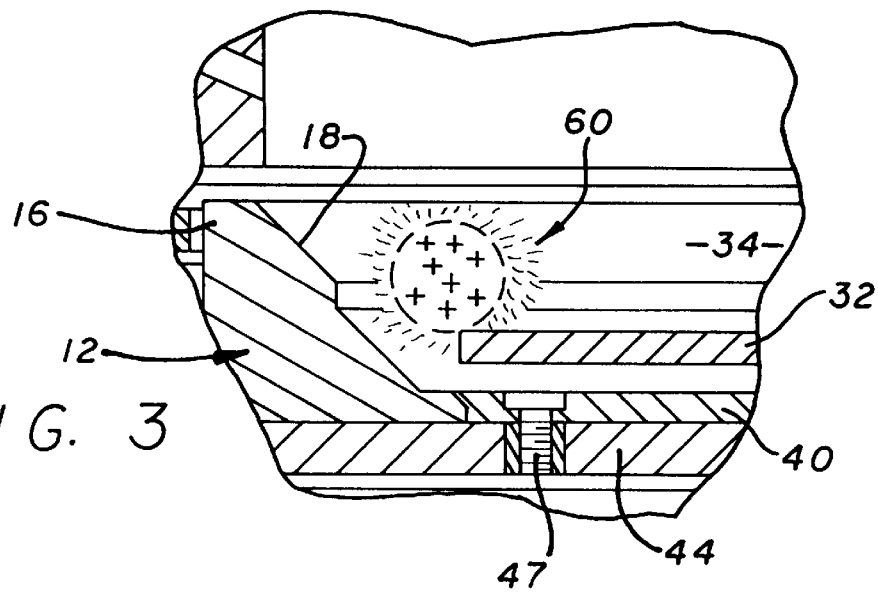
FIG. 3 is an enlarged fragmentary view schematically illustrating on an enlarged basis the portion of the apparatus within the circular line 3 in FIG. 1.

The substrate 14 may hold a plurality of dies 15, each of generally identical construction and each forming, when completed, an integrated circuit chip defining complex electrical circuitry or forming the member contiguous, in a magnetizable head, to a rotatable disc constructed to receive or transfer binary data in magnetizable form. Each die 15 (FIG. 3) may be quite small (e.g. ¼"×¼") so that a considerable number of dies can be formed on a single wafer. Each die 15 may be provided with a surface 17 for receiving a uniform deposition of a layer or layers of material defining the operation of the die.

Figure 2:
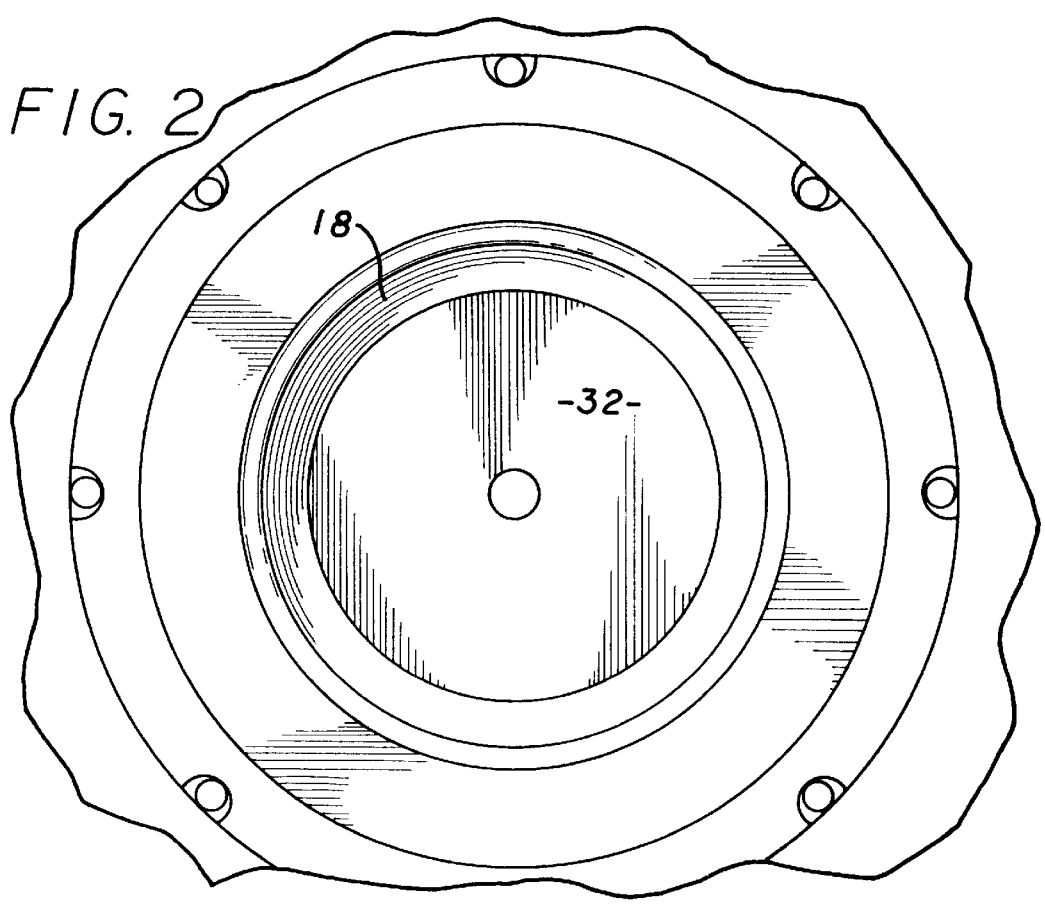
FIG. 2 is a sectional view of the embodiment shown in FIG. 1 and is taken substantially on the line 2—2 of FIG. 1.

The target 12 may be a unitary member, preferably with an annular configuration, as shown in FIGS. 1 and 2. The target 12 may be defined by an annular external periphery 16 and may be provided with a centrally disposed opening defining a frusto-conical internal periphery 18. The target 12 may be made from a suitable material such as aluminum or titanium. The target may receive a radio frequency voltage at a suitable frequency such as approximately thirteen and one half megahertz (13.5 MHz). The RF voltage may have a sufficient amplitude to provide, at 13.5 MHz, an effective negative voltage of approximately four hundred volts (−400V.) on the target 12. The target 12 may also or alternatively receive a direct voltage of a negative polarity and a magnitude to obtain the production of approximately −400V. on the target.

An anode 32 is disposed internally relative to the target 12 and may be supported in any suitable manner well known in the art. The anode may be disposed substantially parallel to, and displaced from, the substrate 14. The anode 32 may be substantially perpendicular to the axis of the frusto-conical configuration of the target 12. The anode may be provided with a voltage of a positive polarity and a magnitude of about fifty volts (+50V.) A chamber or cavity 34 is defined in part by the target 12 and in part by the anode 92. The cavity 34 holds atoms of an inert gas such as argon. The atoms of the inert gas such as argon are introduced to the cavity 34 through an inlet 35. The substrate 14 is preferably displaced from the cavity 34.

The argon may illustratively be introduced into the cavity 34 at a rate of approximately twenty-five cubic centimeters per minute (25cc/min.). This is approximately one half (½) of the rate which would be used if the embodiment were to be used primarily for coating the substrate 14 with a layer of a material such as aluminum or aluminum oxide. The argon atoms pass through the cavity 34 and through an outlet 36. An electrical field is provided between the anode 32 and the target 12 by connecting the anode and the target respectively to the positive and negative terminals of a power supply 38. The electrical field causes electrons to be discharged from the target 12 and to travel toward the anode 32.

A clamp 40 is disposed in the central opening of the target 12 in abutting relationship with the internal periphery 18 of the target. The clamp 40 has a shoulder which overlays the internal periphery 18 of the target 12. The clamp 40 may be made from a suitable material such as copper. The clamp 40 is disposed against a support portion 44 of a cooling member 46 and is attached to the support portion of the cooling member as by screws 47. The construction of the clamp 40 and the associated member such as the cooling member 46 is fully disclosed in co-pending application Ser. No. 441,642 filed in the United States Patent Office on Nov. 27, 1989, for "Apparatus for Depositing a Thin Layer of Gaseous Molecules on a Member" and assigned of record to the assignee of record of this application.

The cooling member 46 has a portion 50 which abuts the external periphery 16 of the target 12. A passageway 52 is respectively disposed in the cooling member 46 and externally of the cooling member to provide for the flow of a fluid such as water to cool the clamp 40 and the target 12. A pair of magnetizable members 54 and 55 enclosing a permanent magnet 56 are disposed on opposite sides of the target 12 to create a magnetic field in the cavity 34. The magnetizable members 54 and 55 and the permanent magnet 56 may be at a ground potential.

An electrical field is produced between the anode 32 and the target 12 to discharge electrons from the anode target. The electrons discharged from the target 12 move in a spiral path from the target toward the anode 32 because the magnetic field produced in the cavity or chamber 34 by the permanent magnet 56 and the magnetizable members 54 and 55 has a component in a direction perpendicular to the electrical field between the anode and the target. Because of this spiral path, the electrons have an ample opportunity to strike and ionize argon atoms in the cavity 34.

The argon ions travel to the frusto-conical internal periphery 18 of the target 12 and cause sputtered atoms to be released from this periphery when the argon ions impinge on such surface. The sputtered atoms travel to the substrate 14 and become deposited on the substrate. As the gaseous material becomes depleted from the frusto-conical periphery 18 of the target 12, the target becomes progressively worn. When the target 12 has become sufficiently worn, the target 12 is removed from the apparatus and is replaced by a new target.

As the sputtered atoms become released from the frusto-conical surface of the target 12, the target becomes heated. This heating is not as great in this embodiment as in other embodiments because the reduced number of argon ions in the cavity 34 would tend to reduce the number of atoms sputtered at each instant from the target 12. However, any heating of the target 12 would tend to cause the target to expand at its external periphery 16 in FIG. 1 because of metal expansion caused by such heat. However, the external periphery 16 of the target 12 is maintained in fixed position by its mechanical abutment with the portion 50 of the cooling member 46 and by the cooling action of the cooling member. This cooling action results from the flow of a cooling fluid such as water through the passageway 52.

Oxygen molecules are also introduced into the cavity 34 through the inlet 35 and are exhausted from the cavity through the outlet 36 after passing through the cavity. Argon and oxygen can be introduced simultaneously into the cavity 34, and can be passed through a common inlet and a common outlet because they do not combine chemically. The rate of passage of the oxygen atoms through the cavity may illustratively be approximately twenty-five cubic centimeters per minute (25cc/min.). The amount of oxygen passing through the cavity 34 at such instant is less than that normally provided such as in the system disclosed and claimed in application Ser. No. 08/564,659 (attorney file D-2694b) filed in the names of Peter J. Clarke and Andrew P. Clarke on Nov. 29, 1995 for "Apparatus For, and Method of, Depositing a Film on a Substrate" and assigned of record to the assignee of record of this application.

A glow discharge of charged particles accumulates near the target 12. This glow discharge is often designated as a plasma. This glow discharge is schematically indicated at 60 in FIG. 3 and may be produced in part from charged particles of argon when the argon is ionized by the electrons from the anode 32. This glow discharge has a potential approaching that of the anode 32. For example, when the anode has a positive potential of fifty volts (+50V.), the glow discharge may approach a positive potential of fifty volts (+50V.).

The glow discharge 60 produces an acceleration of the electrons emitted or discharged from the target 12. These electrons become disposed on the oxygen molecules in the cavity 34. As a result, ions ($O_2^-$) of the oxygen molecules may be produced or the oxygen molecules may be split into oxygen atoms ($O^-$) each having a negative charge. Oxygen molecules ($O_2^+$) +and oxygen atoms ($O^+$) with a positive charge also tend to be produced in the cavity 34. These positively charged molecules and atoms are produced by the bombardment of the oxygen molecules with electrons and argon ions in the cavity.

Since the glow discharge 60 is at approximately fifty volts (+50V.) and the surface of the substrate 14 is floating from the standpoint of potential, the positively ionized oxygen molecules ($O_2^+$) and atoms ($O^+$) are repelled by the glow discharge toward the substrate. These positive ions tend to produce a positive voltage on the surface of the substrate. This positive voltage attracts the negatively charged oxygen molecules ($O_2^-$) and atoms ($O^-$) toward the substrate to neutralize the positive voltage on the substrate. In this way, the substrate 14 tends to be maintained at a floating potential.

The ions of oxygen attracted or repelled to the surface of the substrate 14 react chemically with hydrocarbons on the surface of the substrate to remove such hydrocarbons from such surface. These hydrocarbons are formed from combinations of carbon and hydrogen atoms. The charged ions of oxygen react chemically with the hydrogen atoms to form water vapor. The charged oxygen ions react chemically with the carbon atoms to form carbon dioxide ($CO_2$) and/or carbon monoxide (CO). Both carbon dioxide and carbon monoxide are gases. The water vapor and the carbon dioxide and carbon monoxide gases are withdrawn from the cavity 34 through the outlet 36.

Hydrocarbons on the surface of the substrate 14 are undesirable because layers deposited on a substrate surface with hydrocarbons do not become adhered strongly to the surface. As a result, the layers tend to separate from the substrate surface at the positions at and around the hydrocarbons. This prevents the electrical and magnetic properties of the adhered material from having consistent properties at every position on the surface.

Attempts have been made as by etching or ion bombardment to remove hydrocarbons from the substrate surface. However, when the hydrocarbons have been removed from the substrate surface, pits have been created in such surfaces where the hydrocarbons have been removed. These pits have had significant depths. For example, hydrocarbon molecules may have a width of approximately fifteen Angstroms (15 Å). This width is considerable when considered in relation to a total thickness of approximately seventy-five Angstroms (75 Å) for the material deposited on the surface of the substrate 14. Furthermore, the etching and/or ion bombardment produce pits which have depths greater than the size of the hydrocarbon molecules in order to be certain that the hydrocarbon molecules have been removed.

In contrast to the prior art, the hydrocarbons are removed in this invention from the surface of the substrate by methods which are gentle. This results in part from the fact that the glow discharge 60 is at a relatively low positive potential and the voltage on the substrate 14 is floating or at a low potential slightly different from ground. As a result, only the hydrocarbons, and not any of the material around the hydrocarbons, are removed from the surface of the substrate 14 by the methods included in this invention. Furthermore, the techniques included in this invention affect the surface of the substrate 14 only at the positions where the hydrocarbons are located.

Figure 5:
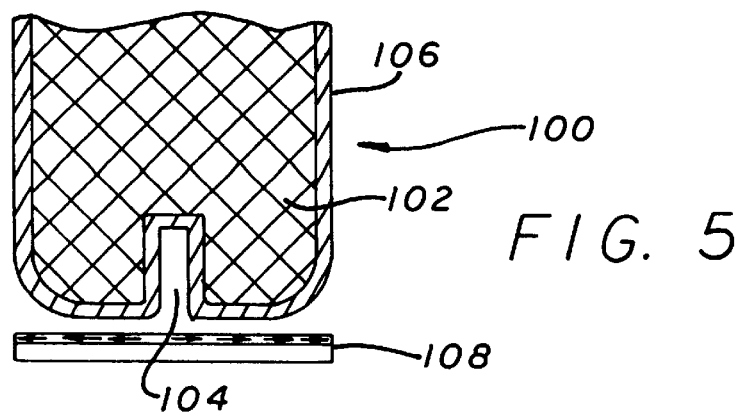
FIG. 5 is an enlarged fragmentary sectional view of a magnetic head on which a magnetizable coating may be formed after the use of the method constituting this invention.

The benefits of the apparatus and methods constituting this amendment may also be seen from the discussion below when the benefits are applied to a member which is included in a magnetic head generally indicated at 100 in FIG. 5. The magnetic head may include a member 102 which is provided with an air gap 104. The member 102 may be coated with a deposition 106 having magnetizable properties. For example, the deposition 106 may be ferromagnetic. The magnetic head 100 may be disposed in contiguous relationship to a transducing member such as a disc 108. The disc 108 is adapted to be rotated at a relatively high speed to provide a transducing action for the transfer of information in magnetizable form between information on the disc 108 and information in the head 100. The magnetizable coating 106 enhances this transducing action.

Figure 4:
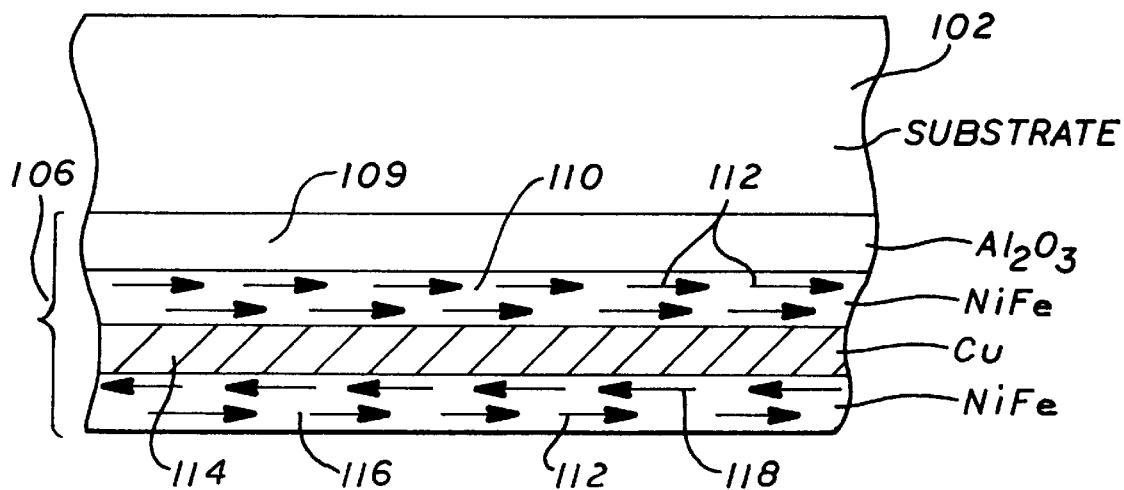
FIG. 4 is a schematic fragmentary view showing on an enlarged basis the substrate within the circular line 4 in FIG. 1.

The member 102 (FIG. 4) may be considered to constitute the substrate 14. The deposition 106 on the member 102 may be considered to be formed from a plurality of layers.

For example, the substrate 102 may be coated with a first layer 109 of an insulating material such as aluminum oxide ($Al_2O_3$). A layer 110 formed from a magnetizable material may then be deposited on the layer of aluminum oxide. For example, the magnetizable material may be ferromagnetic, an alloy of nickel and iron being a good example. The layer 110 may have a thickness of approximately seventy-five Angstrom (75 Å). The layer 110 may be permanently magnetized in a particular direction as indicated by arrows 112.

A layer 114 of a suitable material such as copper may then be deposited on the layer 110 in a suitable thickness such as approximately twenty Angstrom (20 Å). A layer 116 of a magnetizable material such as the alloy of nickel and iron may then be deposited on the layer 114. The thickness of the layer 116 may be approximately seventy-five Angstrom (75 Å). A magnetic head 100 with members corresponding to the member 102 and with layers corresponding to the layers 109, 110, 114 and 116 on the member is well known in the art.

The layer 116 can be magnetized in opposite directions to indicate binary information. For example, the layer 116 can be magnetized in the direction 112 to indicate a binary "1" and can be magnetized in a direction 118 opposite to the direction 112 to indicate a binary "0". When the magnetization of the layer 116 is in the direction 112, a low resistivity is produced between the layers. When the layer 116 is magnetized in the direction 118 opposite to the direction 112, a high resistivity is produced between the layer. As will be appreciated, only one of the magnetizations 112 and 118 can be provided in the layer 116 at any one time.

As will be appreciated, it is desirable to have the resistivity between the layers 110 and 116 at as high a value as possible in order to enhance the difference between a binary "1" and a binary "0". The apparatus and method of this invention increase the resistivity between the layers 110 and by as much as six percent (6%). This enhances the ease with which a binary "1" can be distinguished from a binary "0".

It also allows for an increase in the speed at which the disc 108 can be moved relative to the head 100 while still providing a reading of binary information from the disc 108 to the head 100 or a recording on the disc of binary information in the head. It also increases the life of the head 100 since the layers 109, 110, 114 and 116 are adhered firmly to the member 102.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

I claim:

1. In combination
    an anode,
    a target spaced from the anode to serve as a cathode and defining a cavity with the anode,
    a substrate disposed in spaced relationship to the anode and the target,
    first means for passing molecules of oxygen at a particular rate through the cavity to obtain an oxidation of hydrocarbons on the surface of the substrate to vapors and gases,
    second means for applying a positive voltage to the anode and a negative voltage to the target relative to the positive voltage on the anode to establish a flow of electrons from the target toward the anode and an ionization of the molecules of the oxygen by the electrons for a flow of the ionized molecules of the oxygen to the surface of the substrate with an energy level to obtain only a chemical reaction between the oxygen and the hydrocarbons for the vaporization and the gasification of the hydrocarbons on the surface of the substrate, and
    third means disposed relative to the anode and the target for providing a movement of the electrons between the target and the anode through other than a straight line path to facilitate the ionization of the molecules of the oxygen by the electrons.

2. In a combination as set forth in claim 1,
    the substrate having a surface facing the anode, the surface having electrically insulating properties,
    the substrate surface receiving the ionized molecules of oxygen with an energy level preventing the removal of the material on the surface of the substrate around the hydrocarbons.

3. In a combination as set forth in claim 2,
    the substrate surface facing the anode receiving the ionized molecules of oxygen with an energy level to provide a vaporization of the hydrocarbons without any etching of the substrate surface by the oxygen.

4. In a combination as set forth in claim 2, including,
    the substrate having a floating potential relative to potentials on the target and the anode.

5. In a combination as set forth in claim 1,
    the target having a frusto-conical hollow configuration and the cavity being partially defined by the hollow frusto-conical configuration of the target and
    the target having an axis for the hollow frusto-conical configuration of the target and the anode being substantially perpendicular to the axis of the target.

6. In a combination as set forth in claim 1,
    the first means being operative to introduce an inert gas into the cavity at a rate to enhance the vaporization and the gasification of the hydrocarbons on the surface of the substrate by the oxygen ions.

7. In a combination as set forth in claim 4,
    the target having a hollow frusto-conical surface to partially define the cavity and the anode being within the cavity in displaced and substantially perpendicular relationship to the anode and the substrate being displaced from the cavity in substantially parallel relationship to the anode.

8. In a combination as set forth in claim 5, wherein
    the substrate and the anode are planar and wherein
    the substrate and the anode are disposed in substantially parallel relationship to each other and in substantially perpendicular relationship to the target.

9. In a combination as set forth in claim 6 wherein
    the substrate is at a floating potential relative to potentials on the anode and the target.

10. In a combination as set forth in claim 6 wherein
    the first means provides for the passage of the inert gas and the oxygen through the cavity at rates of approximately twenty-five standard cubic centimeters per minute (25 cc/min).

11. In a combination as set forth in claim 1, wherein
    the substrate and the anode are planar and wherein
    the substrate and the anode are disposed in a substantially parallel relationship to each other and in a substantially perpendicular relationship to the target and wherein
    the substrate is at a floating potential relative to potentials on the anode and the target.

12. In combination for removing hydrocarbons from the surface of a substrate,
    an anode,
    a hollow target spaced from the anode to serve as a cathode,
    there being a cavity defined in part by the anode and the hollow target to receive molecules of an inert gas and to receive molecules of oxygen,
    first means for providing for the passage of the inert gas and the oxygen through the cavity,
    second means for applying a positive voltage to the anode and for applying to the target a voltage negative relative to the positive voltage on the anode to produce a flow of electrons from the target toward the anode and to establish a glow discharge between the target and the anode to ionize atoms of the inert gas and the molecules of the oxygen and to obtain a movement of the ions of the inert gas to the target for the sputtering of atoms from the target and the movement of the atoms toward the substrate and to obtain a movement of the ionized oxygen to the surface of the substrate with an energy level only for vaporizing and gasifying the hydrocarbons on the surface of the substrate, and
    the concentration of the inert gas and the oxygen in the cavity being less than that used for producing a deposition of an oxide of the material of the target on the substrate, and
    third means for producing a magnetic field between the anode and the target to provide for the movement of the electrons between the anode and the target in a convoluted path for enhancing the ionization of the atoms of the inert gas and the molecules of the oxygen in the cavity.

13. In a combination as set forth in claim 12 wherein
    the first means provides for the passage of the inert gas and the oxygen through the cavity at approximately the same flow rates.

14. In a combination as set forth in claim 12 wherein the first means provides for the passage of the inert gas and the oxygen through the cavity at rates of approximately twenty-five standard cubic centimeters per minute (25 cc/min).

15. In a combination as set forth in claim 12 wherein the target has a hollow frusto-conical configuration to partially define the cavity within the hollow frusto-conical configuration and wherein the anode is in substantially perpendicular relationship to the axis of the target to partially define the cavity.

16. In a combination as set forth in claim 13, wherein the substrate is disposed outside of the cavity in substantially parallel relationship to the anode.

17. In a combination as set forth in claim 12 wherein a potential of the substrate is floating relative to the potentials on the anode and the target.

18. In combination for removing hydrocarbons from a surface of a substrate, an anode constructed to be disposed in spaced and substantially parallel relationship to the substrate, a target displaced from the anode to partially define a cavity for receiving atoms of an inert gas and molecules of oxygen in the cavity, first means for passing the inert gas and the oxygen through the cavity, second means for providing a positive voltage on the anode to produce a flow of electrons from the target toward the anode and to establish a glow discharge between the target and the anode and to provide for an ionization by such electrons of atoms of the inert gas and molecules of the oxygen in the cavity, third means for providing a negative voltage on the target relative to the positive voltage on the anode to produce an electrical field between the anode and the target, and fourth means for creating a magnetic field in the cavity in a direction substantially perpendicular to the electrical field between the anode and the target to create a force on the electrons for a movement of the electrons between the anode and the target through other than a straight line path and to enhance the ionization of the atoms of the inert gas and molecules of the oxygen in the cavity, the anode having a potential, and the substrate having a floating potential, providing for a movement of ionized molecules of oxygen to the surface of the substrate with an energy level to react chemically with the hydrocarbons for vaporizing and gasifying the hydrocarbons on the surface of the substrate without removal of material on the surface of the substrate around the hydrocarbons.

19. In a combination as set forth in claim 18, the target having a hollow substantially frusto-conical configuration with an axis substantially perpendicular to the anode and the anode being disposed relative to the hollow frusto-conical configuration of the target to provide for a flow of ionized molecues of oxygen to the surface of the the substrate with an energy level to react chemically with the hydrocarbons for vaporizing and gasifying the hydrocarbons on the surface of the substrate.

20. In a combination as set forth in claim 18, including, the fourth means being at substantially ground potential and the substrate being disposed outside of the cavity in substantially parallel relationship to the anode.

21. In a combination as set forth in claim 18, including, means for cooling the target.

22. In a combination as set forth in claim 18, including the fourth means being at a substantially ground potential and the substrate being disposed outside of the cavity in substantially parallel relationship to the anode, and means for cooling the target.

23. In a combination as set forth in claim 18, including, the first means being operative to pass the inert gas and the oxygen through the cavity at substantially the same flow rates.

24. In a combination as set forth in claim 19, the first means being operative to pass the inert gas and the oxygen through the cavity at flow rates of approximately twenty-five cubic centimeters per minute (25 cc/min).

25. In combination, an anode, a target spaced from the anode to serve as a cathode and defining a cavity with the anode, a substrate disposed in spaced relationship to the anode and the target, first means for passing molecules of oxygen and atoms of an inert gas at a particular rate through the cavity to obtain an oxidation of hydrocarbons on the surface of the substrate to vapors and gases, second means for providing a positive voltage on the anode to produce a flow of electrons from the target and to establish a glow discharge between the target and the anode and to provide for an ionization, by such electrons, of atoms of the inert gas and molecules of the oxygen in the cavity, third means for providing a negative voltage on the target relative to the positive voltage on the anode to produce an electrical field between the anode and the target, fourth means for creating a magnetic field in the cavity in a direction substantially perpendicular to the electrical field between the anode and the target to create a force on the electrons for a movement of the electrons between the anode and the target through other than a straight line path for enhancing the ionization of the atoms of the inert gas and the molecules of the oxygen in the cavity, the potential on the anode relative to the potential on the substrate providing for the movement of ionized molecules of oxygen to the surface of the substrate with an energy level to react chemically with the hydrocarbons for vaporizing and gasifying the hydrocarbons on the surface of the surface without any etching by the oxygen of the substrate surface.

26. In a combination as set forth in claim 25 wherein the substrate has a floating potential.

27. In a combination as set forth in claim 25 wherein the oxygen and the inert gas flow through the cavity at a rate to provide for the chemical reaction of the oxygen with the hydrocarbons without any etching by the oxygen of the substrate surface.

28. In a combination as set forth in claim 26 wherein the first means provides for the passage of the inert gas and the oxygen through the cavity at rates of approximately twenty five standard cubic centimeters per minute (25 cc/min.) and wherein the substrate and the anode are disposed in substantially parallel relationship to each other and in substantially perpendicular relationship to the target.

29. In a combination as set forth in claim 25 wherein the first means is operative to introduce the inert gas into the cavity at a rate to enhance the vaporization and the gasification of the hydrocarbons on the surface of the substrate by the ionized oxygen ions.

30. In a combination as set forth in claim 28 wherein the target has a frusto-conical hollow configuration and the cavity is partially defined by the hollow frusto-conical configuration of the target and wherein the first means is operative to introduce the inert gas into the cavity at a rate to enhance the vaporization and the gasification of the hydrocarbons on the surface of the substrate by the ionized molecules of oxygen.

* * * * *

UNITED STATES PATENT AND TRADEMARK OFFICE
CERTIFICATE OF CORRECTION

PATENT NO. : 5,914,017
DATED : June 22, 1999
INVENTOR(S) : Peter J. Clarke

It is certified that error appears in the above-identified patent and that said Letters Patent is hereby corrected as shown below:

<u>Column 9, Claim 17,</u>
Line 16, before "potentials", delete "the".

Signed and Sealed this

Thirty-first Day of July, 2001

*Attest:*

NICHOLAS P. GODICI
*Attesting Officer*     Acting Director of the United States Patent and Trademark Office